(12) United States Patent
Saito

(10) Patent No.: US 7,739,560 B2
(45) Date of Patent: Jun. 15, 2010

(54) NONVOLATILE SEMICONDUCTOR MEMORY DEVICE AND METHOD OF SELF-TESTING THE SAME

(75) Inventor: Hidetoshi Saito, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 450 days.

(21) Appl. No.: 11/567,995

(22) Filed: Dec. 7, 2006

(65) Prior Publication Data
US 2007/0165454 A1 Jul. 19, 2007

(30) Foreign Application Priority Data
Dec. 9, 2005 (JP) ............................. 2005-356447

(51) Int. Cl.
*G11C 29/00* (2006.01)
(52) U.S. Cl. .................. 714/710; 714/711; 714/718; 714/723; 365/201
(58) Field of Classification Search .................. 714/710, 714/711, 718, 723; 365/201
See application file for complete search history.

(56) References Cited

U.S. PATENT DOCUMENTS

| | | | | | |
|---|---|---|---|---|---|
| 5,509,134 | A | * | 4/1996 | Fandrich et al. ............. | 711/103 |
| 5,961,653 | A | * | 10/1999 | Kalter et al. ................... | 714/7 |
| 6,182,257 | B1 | * | 1/2001 | Gillingham ................. | 714/733 |
| 6,343,366 | B1 | | 1/2002 | Okitaka | |
| 6,587,982 | B1 | * | 7/2003 | Lee et al. .................... | 714/733 |
| 6,631,086 | B1 | * | 10/2003 | Bill et al. ............... | 365/185.09 |
| 6,650,583 | B2 | * | 11/2003 | Haraguchi et al. .......... | 365/201 |
| 6,760,865 | B2 | | 7/2004 | Ledford et al. | |
| 6,829,181 | B1 | * | 12/2004 | Seitoh ......................... | 365/201 |
| 7,318,181 | B2 | * | 1/2008 | Naso et al. ................... | 714/723 |
| 2002/0131307 | A1 | * | 9/2002 | Murai et al. ................ | 365/200 |
| 2003/0204783 | A1 | * | 10/2003 | Kuroda ....................... | 714/35 |
| 2004/0049724 | A1 | | 3/2004 | Bill et al. | |
| 2005/0028058 | A1 | | 2/2005 | Perner | |

FOREIGN PATENT DOCUMENTS

JP 2001-148199 5/2001
JP 2003-208797 7/2003

\* cited by examiner

*Primary Examiner*—John J Tabone, Jr.
(74) *Attorney, Agent, or Firm*—Oblon, Spivak, McClelland, Maier & Neustadt, L.L.P.

(57) ABSTRACT

A test interface receives a test command designating execution of a test for a memory cell. The test storage circuit stores test information necessary to execute the test. The test storage circuit includes an erasable programmable storage unit. The decoder decodes the test command input to the test interface, and selects the test information stored in the test storage circuit. The sense amplifier reads out, from the test storage circuit, the test information selected by the decoder. The holding circuit holds the test information read out by the sense amplifier. The control circuit controls a test operation of checking whether the memory cell normally operates, on the basis of the test information held in the holding circuit. The defect storage circuit is formed for the memory cell, and stores fail information indicating that the memory cell is defective if the memory cell does not normally operate in the test operation.

20 Claims, 4 Drawing Sheets

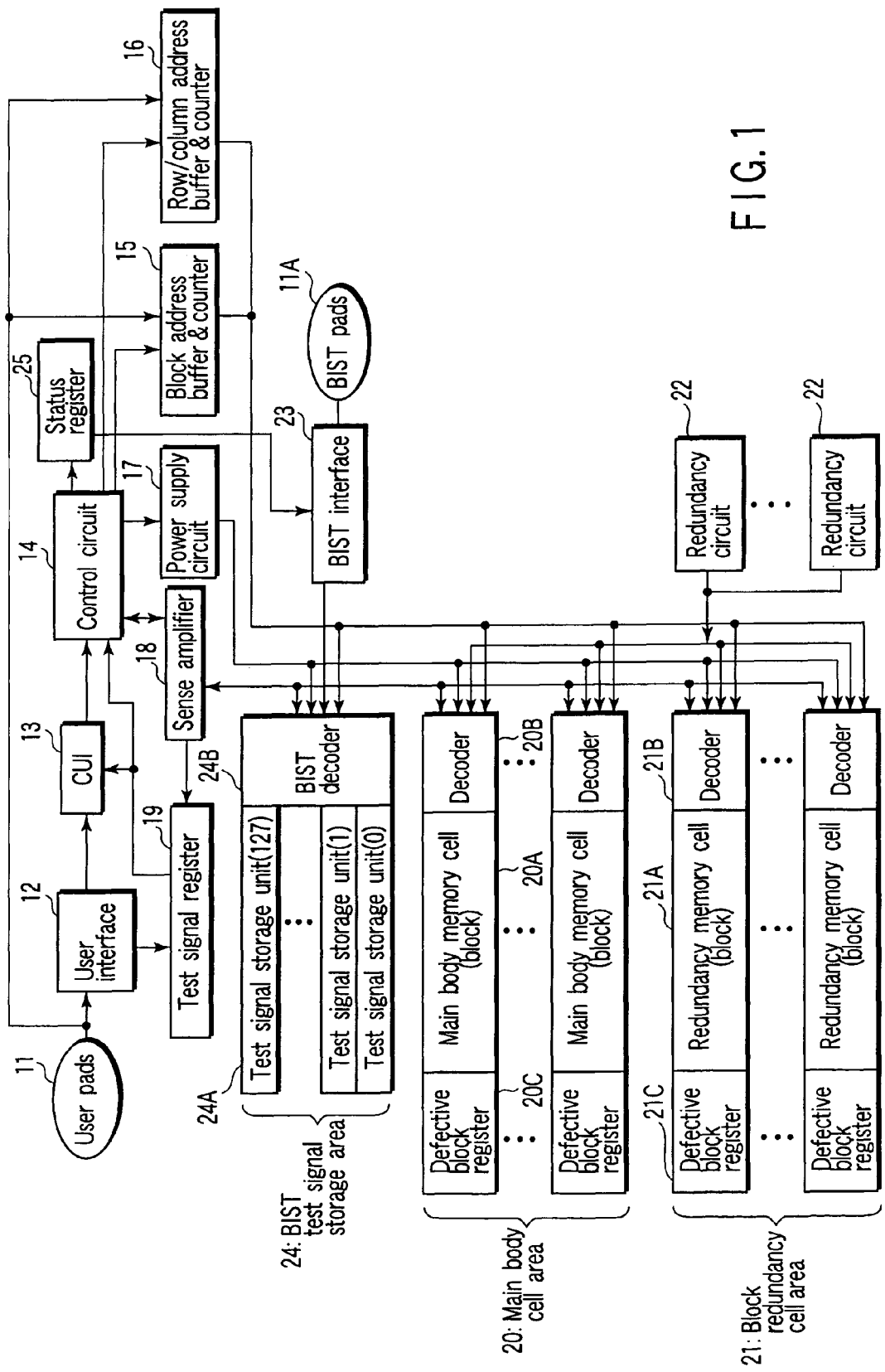
F I G. 1

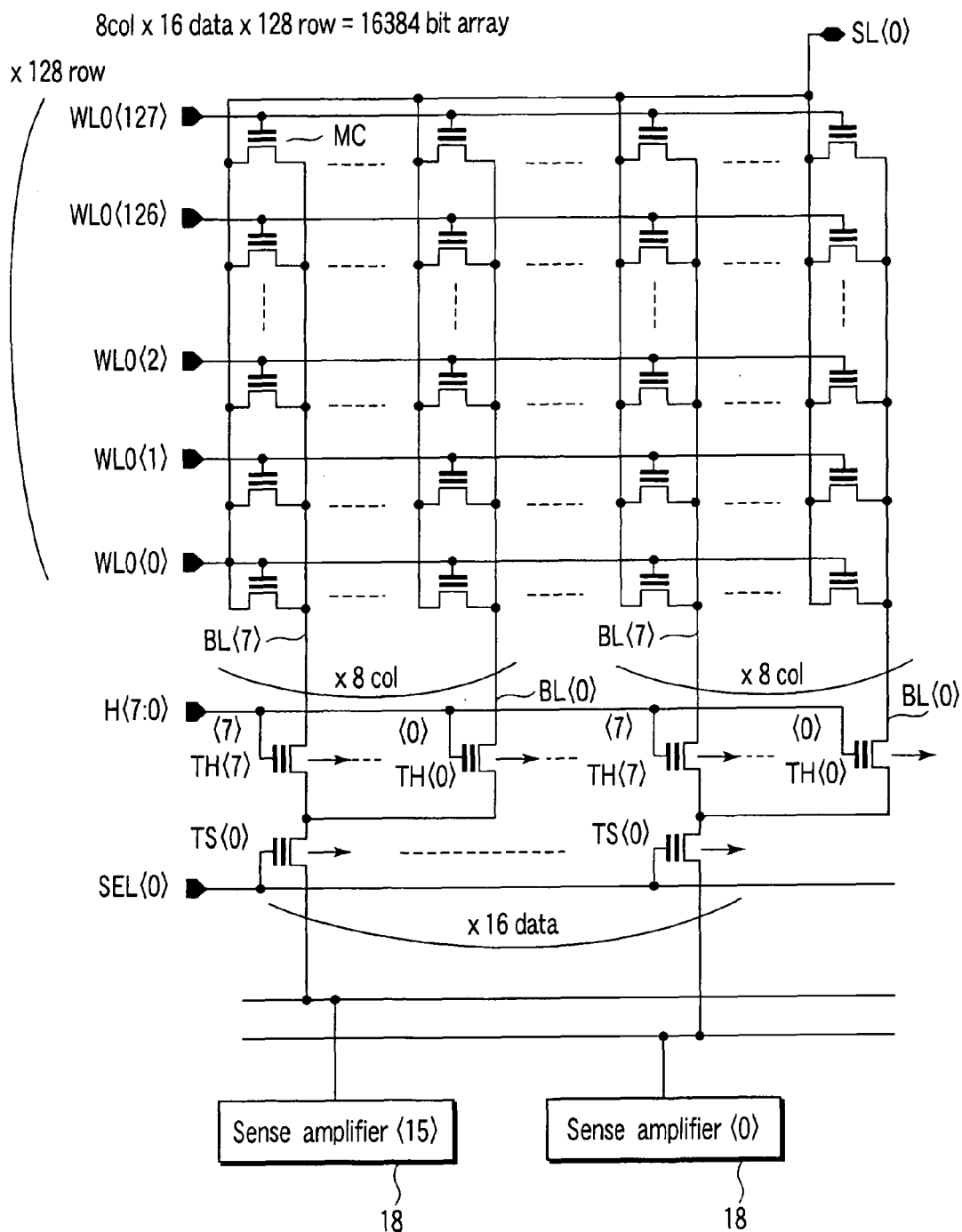
F I G. 2

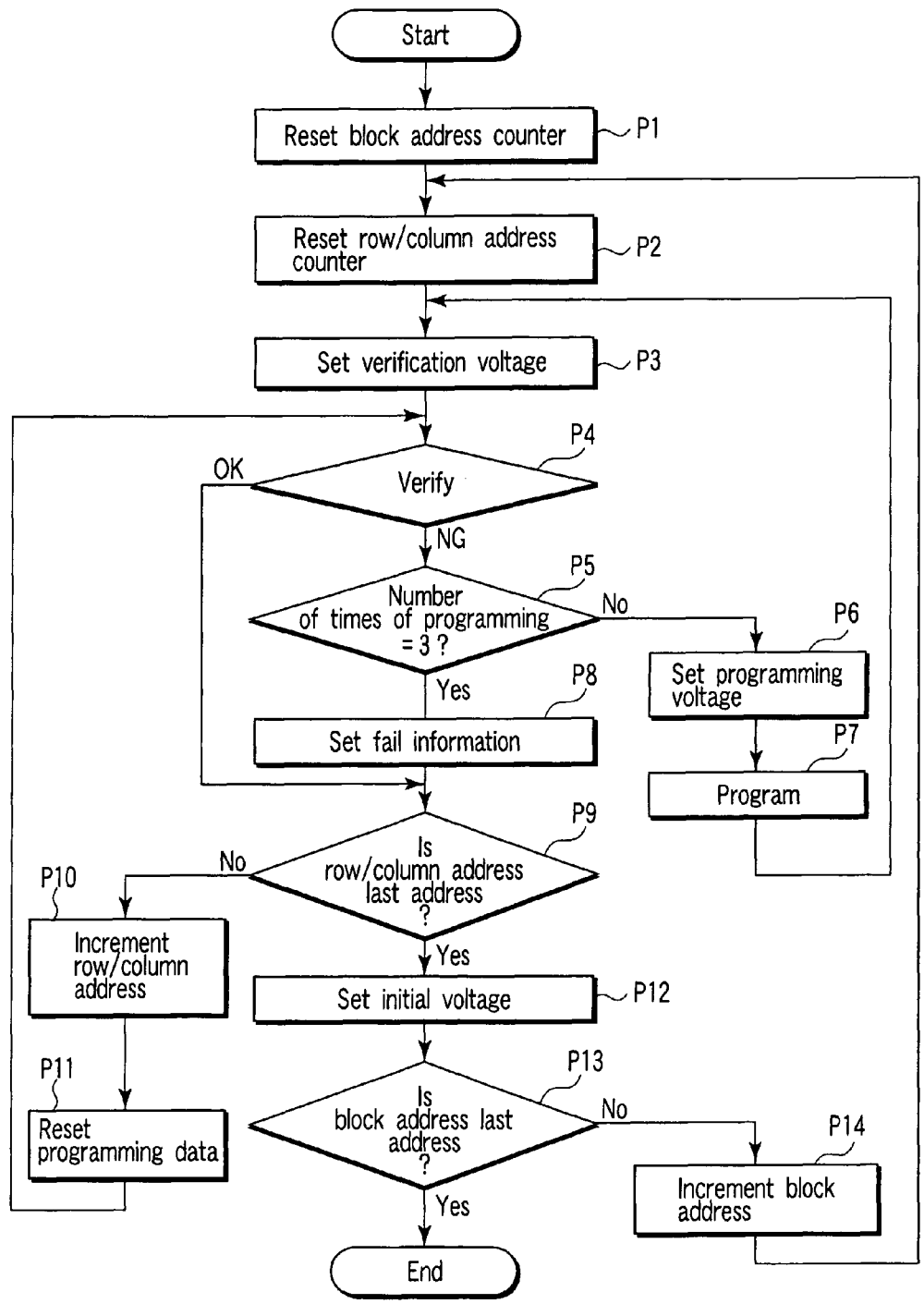
F I G. 4

US 7,739,560 B2

NONVOLATILE SEMICONDUCTOR MEMORY DEVICE AND METHOD OF SELF-TESTING THE SAME

CROSS-REFERENCE TO RELATED APPLICATIONS

This application is based upon and claims the benefit of priority from the prior Japanese Patent Application No. 2005-356447, filed Dec. 9, 2005, the entire contents of which are incorporated herein by reference.

BACKGROUND OF THE INVENTION

1. Field of the Invention

The present invention relates to a nonvolatile semiconductor memory device having a built-in self-test (BIST) function and a method of self-testing the same, e.g., a NOR flash memory having the BIST function and a self-testing method which performs a test by using the BIST function.

2. Description of the Related Art

Recently, a nonvolatile semiconductor memory device (chip) has the BIST function of self-testing whether memory cells are normally operating. The BIST is a technique which enables a self-test by forming a circuit for generating a signal for conducting the self-test inside a chip, so as to perform the self-test inside the chip by only supplying minimum necessary inputs such as electric power, a clock signal, and a predetermined signal to the chip (e.g., Jpn. Pat. Appln. KOKAI Publication No. 2000-227459).

As described above, a nonvolatile semiconductor memory device must be tested to check whether the chip is normally operating by using the BIST, but the increase in test time is becoming a problem as the storage capacity increases. In particular, the test time of the BIST conducted in a NOR flash memory prolongs because an erase operation requires a long time.

To reduce the test time, therefore, the number of chips which can be tested by one measurement is increased by simultaneously testing a plurality of chips, thereby practically shortening the test time for one chip.

Unfortunately, the number of pads to be brought into contact with a probe is physically limited, and this limits the number of chips which can be tested at the same time by one measurement. This makes it impossible to shorten the test time as planned.

BRIEF SUMMARY OF THE INVENTION

A nonvolatile semiconductor memory device of the present invention according to the first aspect comprises:

a memory cell which stores information;

a test interface which receives a test command designating execution of a test for the memory cell;

a test storage circuit which stores test information necessary to execute the test designated by the test command, the test storage circuit comprising an erasable programmable storage unit;

a decoder which decodes the test command input to the test interface, and selects the test information stored in the test storage circuit;

a sense amplifier which reads out, from the test storage circuit, the test information selected by the decoder;.

a holding circuit which holds the test information read out by the sense amplifier;

a control circuit which controls a test operation of checking whether the memory cell normally operates, on the basis of the test information held in the holding circuit; and a defect storage circuit formed for the memory cell, the defect storage circuit storing fail information indicating that the memory cell is defective if the memory cell does not normally operate in the test operation performed by the control circuit.

A nonvolatile semiconductor memory device of the present invention according to the second aspect comprises:

a plurality of memory cell blocks in which a plurality of memory cells which store information are arranged;

a test interface which receives a test command designating execution of a test for the plurality of memory cell blocks;

a plurality of test storage circuits which store test information necessary to execute the test designated by the test command, each of the plurality of test storage circuits comprising an erasable programmable storage unit;

a decoder which decodes the test command input to the test interface, and selects a specific test storage circuit from the plurality of test storage circuits on the basis of a decoding result;

a sense amplifier which reads out the test information from the test storage circuit selected by the decoder;

a holding circuit which holds the test information read out by the sense amplifier;

a control circuit which controls a test operation of checking whether the plurality of memory cell blocks normally operate, on the basis of the test information held in the holding circuit; and a plurality of defective block storage circuits arranged in one-to-one correspondence with the plurality of memory cell blocks, each of the plurality of defective block storage circuits storing fail information indicating that a memory cell block is defective if the memory cell block does not normally operate in the test operation performed by the control circuit.

A method of self-testing a nonvolatile semiconductor memory device of the present invention according to the third aspect comprises:

writing test information necessary to execute a test to be designated by a test command and conducted on a memory cell, in a test storage circuit comprising an erasable programmable storage unit;

inputting the test command to a test interface;

selecting the test information from the test storage circuit in accordance with the input test command;

reading out the selected test information from the test storage circuit and holding the readout test information;

controlling a test operation of checking whether the memory cell normally operates, on the basis of the held test information;

storing, in a defect storage circuit, fail information indicating that the memory cell is defective, if the memory cell does not normally operate in the test operation;

replacing the defective memory cell with a redundancy memory cell if the fail information is stored in the defect storage circuit; and storing an address of the defective memory cell replaced with the redundancy memory cell in a redundancy circuit.

BRIEF DESCRIPTION OF THE SEVERAL VIEWS OF THE DRAWING

FIG. 1 is a block diagram showing the arrangement of a NOR flash memory of an embodiment of the present invention;

FIG. 2 is a circuit diagram showing the arrangement of a test signal storage unit in the NOR flash memory of the embodiment;

FIG. 4 is a flowchart showing an example of execution of test in the flowchart shown in FIG. 3.

DETAILED DESCRIPTION OF THE INVENTION

Figure 3:
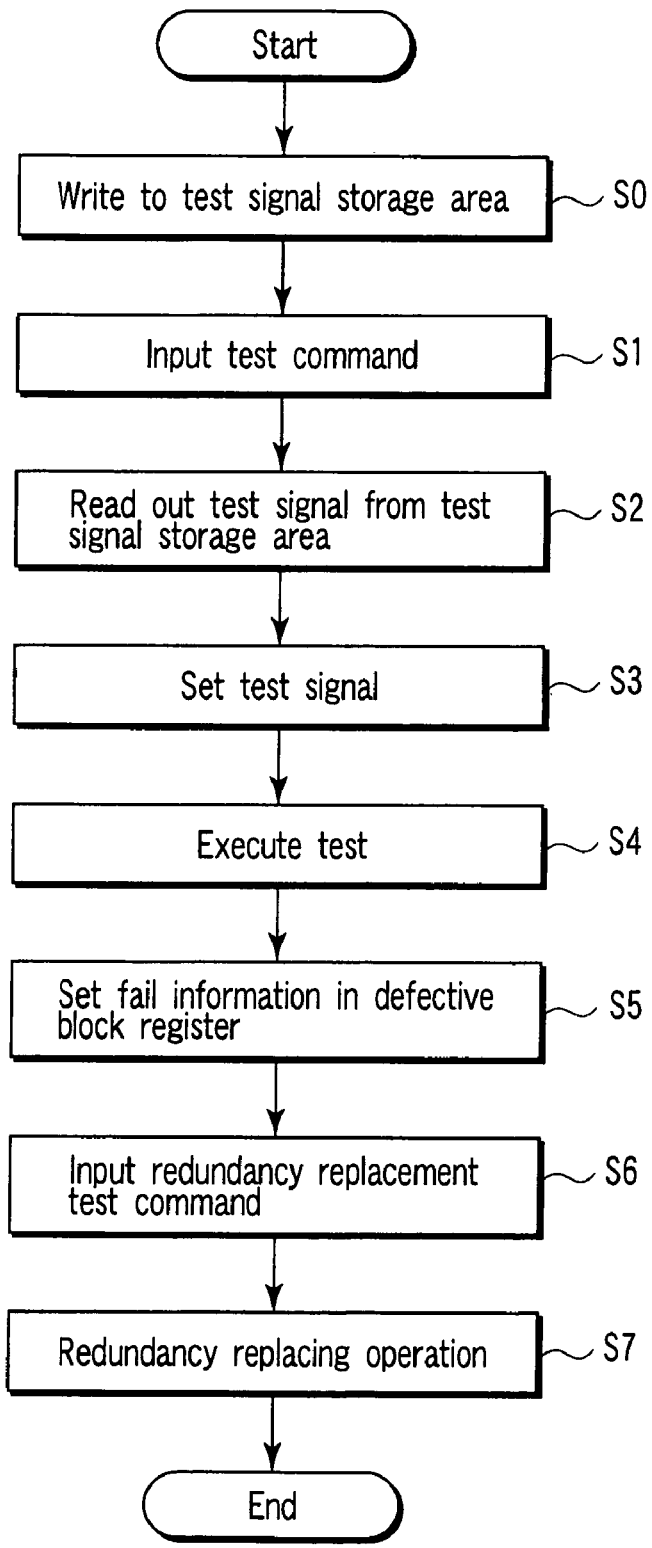
FIG. 3 is a flowchart showing the operation of a BIST in the NOR flash memory of the embodiment.

A nonvolatile semiconductor memory device of an embodiment of the present invention will be explained below with reference to the accompanying drawing. This embodiment will take a NOR flash memory as an example. In the following explanation, the same reference numerals denote the same parts throughout the drawing.

The NOR flash memory of the embodiment of the present invention will be explained below. FIG. 1 is a block diagram showing the arrangement of the NOR flash memory of the embodiment.

This NOR flash memory comprises user pads 11, a user interface 12, a command user interface (CUI) 13, a control circuit 14, a block address buffer & counter 15, a row/column address buffer & counter 16, a power supply circuit 17, a sense amplifier 18, a test signal register 19 corresponding to a holding circuit, a main body cell area 20, a block redundancy cell area 21, redundancy circuits 22, BIST pads 11A, a BIST interface 23 corresponding to a test interface, a BIST test signal storage area 24, and a status register 25 corresponding to a status storage circuit.

The user pads 11 have 40 to 50 pads normally used by the user, and receive addresses, data, electric power, and various commands. The user interface 12 outputs these signals input to the user pads 11 to the command user interface 13 and to the test signal register 19. The command user interface 13 checks a command on the basis of the input signals from the user interface 12, and outputs a signal designating the command to the control circuit 14. The block address buffer & counter 15 and row/column address buffer & counter 16 store block addresses and row/column address input to the user pads 11, and output these addresses to the main body cell area 20, block redundancy cell area 21, and BIST test signal storage area 24.

The control circuit 14 receives a control signal from the command user interface 13, and controls the sense amplifier 18, power supply circuit 17, block address buffer & counter 15, row/column address buffer & counter 16, status register 25, and the like. The sense amplifier 18 reads out data stored in the main body cell area 20, block redundancy cell area 21, and BIST test signal storage area 24, or writes data in these areas. The power supply circuit 17 supplies a write voltage and erase voltage when data is written in and erased from the main body cell area 20, block redundancy cell area 21, and BIST test signal storage area 24.

The main body cell area 20 has main body memory cells (blocks) 20A, decoders 20B, and defective block registers 20C corresponding to defect storage circuits. The main body memory cell 20A comprises NOR memory cells and stores ordinary data. The decoder 20B receives a block address and row/column address from the block address buffer & counter 15 and row/column address buffer & counter 16, and selects a memory cell in the main body memory cell 20A by decoding these addresses. In addition, if a defective memory cell exists in the main body memory cell 20A, the defective block register 20C stores fail information indicating that the main body memory cell is defective. Note that the main body memory cell 20A is a minimum unit (block) in which, for example, data is simultaneously erased upon data erase.

The block redundancy cell area 21 has redundancy memory cells (blocks) 21A, decoders 21B, and defective block registers 21C. If the main body memory cell 20A is defective, the redundancy memory cell 21A replaces the defective main body memory cell in order to remedy it. If the defective main body memory cell 20A is replaced with the redundancy memory cell 21A, the decoder 21B receives a block address and row/column address from the block address buffer & counter 15 and row/column address buffer & counter 16, and selects a memory cell in the redundancy memory cell 21A by decoding these addresses. If a defective memory cell exists in the redundancy memory cell 21A, the defective block register 21C stores fail information indicating that the redundancy memory cell is defective. When the defective main body memory cell 20A is replaced with the redundancy memory cell 21A, the redundancy circuit 22 stores block address information indicating the address of the replaced defective main body memory cell. Note that the redundancy memory cell 21A is a minimum unit (block) in which, for example, data is simultaneously erased upon data erase.

The BIST pads 11A have six pads to be used to execute a test. One of these six pads is used only as a test pad which receives an enable signal EN, and the five remaining pads receive a clock signal SCLK, data input/output (I/O), output enable signal OE, power supply voltage VDD, and reference voltage (e.g., ground potential) Vss which are also input to the user pads 11. Of these pads, the data input/output (I/O) pad is used to receive a test command. Serially inputting 1-bit data eight times allows the NOR flash memory to distinguish between 8-bit ($2^7=128$) test commands.

The BIST test signal storage area 24 has test signal storage units (0) to (127) 24A corresponding to test storage circuits, and a BIST decoder 24B. The BIST interface 23 converts the input test command as 8-bit serial data into 8-bit parallel data, and outputs the converted data to the BIST decoder 24B. The BIST decoder 24B decodes the test command received from the BIST interface 23, and selects one of the test signal storage units (0) to (127) 24A in the BIST test signal storage area 24. The test signal storage units (0) to (127) 24A comprise NOR memory cells, and each store a test signal indicating test conditions necessary to execute a test.

The test signal register 19 stores the test signal read out from one of the test signal storage units (0) to (127), and outputs the test signal to the control circuit 14. The status register 25 stores information indicating that a test is being executed, or information of a test defect found by the test. The test defect information indicates that, for example, the defective main body memory cell 20A cannot be replaced with the redundancy memory cell 21A, so the address designating the defective main body memory cell 20A remains. The BIST pads 11A can read out these pieces of information stored in the status register 25. Note that the test signal storage units (0) to (127) comprise NOR memory cells in this embodiment, but they may also comprise storage means capable of erase and write, e.g., registers. It is also possible to conduct a test by directly inputting a test signal from the user pads 11 to the test signal register 19.

FIG. 2 is a circuit diagram showing the arrangement of the test signal storage units (0) to (127) 24A in the BIST test signal storage area 24.

The test signal storage units 24A comprise 16,384 bits (=8 columns×16 data×128 rows) of memory cells MC. As shown in FIG. 2, the memory cells MC are arranged in a matrix. Each memory cell MC is a nonvolatile memory cell having a control gate and floating gate, and programmable.

Bit lines BL<0> to BL<7> are connected to the drains of the memory cells MC arranged in the column direction, and connected to sense amplifiers 18 via selection transistors TH<0> to TH<7> and TS<0>. A source line SL<0> is connected to the sources of the memory cells MC arranged in the column direction. In addition, word lines WL0<0> to WL0<127> are connected to the control gates of the memory cells MC arranged in the row direction. Note that the memory cell arrays forming the main body memory cells 20A and redundancy memory cells 21A comprise nonvolatile memory cells arranged in a matrix as shown in FIG. 2.

The operation of the BIST in the NOR flash memory of the embodiment of the present invention will be explained below. FIG. 3 is a flowchart showing the operation of the BIST in the NOR flash memory of the embodiment.

First, data is input from the user pads 11, and the command user interface 13, control circuit 14, sense amplifier 18, and the like are used to write test signals for determining the test conditions of tests to be executed, in the test signal storage units (0) to (127) of the BIST test signal storage area 24 (step S0).

Then, a test command is input by using the BIST pads 11A. The test command is used to allow the device to detect the test to be executed. In this test command input, serially inputting 1-bit data eight times from the I/O pad of the BIST pads 11A allows the device to distinguish between 27=128 types of commands. Although 128 types of test commands can be input by serially inputting 1-bit data eight times, the number of test commands can be readily changed by increasing or decreasing the number of times of serial input (step S1).

The test command input from the BIST pads 11A is then input to the BIST decoder 24B via the BIST interface 23. The BIST decoder 24B decodes the input test command and selects one of the test signal storage units (0) to (127). That is, the 8-bit data input as a test command is directly used as an address for designating a test signal storage unit. The test conditions of different tests can be set in the test signal storage units (0) to (127) by prewriting test signals representing the test conditions necessary to execute the tests in the NOR memory cells forming the test signal storage units.

Subsequently, the test signal for determining the test conditions is read out from the test signal storage unit designated by the test command (step S2), and set in the test signal register 19 (step S3). The sense amplifier 18 used for data read from the main body memory cells 20A is used to read out the test signal from the test signal storage unit. Since this obviates the need for a new sense amplifier, the increase in number of circuits can be prevented. Assuming that the sense amplifier 18 can read out 16-bit data at once and the test signal stored in one test signal storage unit is 128-bit data, 128-bit data can be set in the test signal register 19 by repeating test signal read (step S2) and test signal setting (step S3) eight times (16 bits×8=128 bits).

The control circuit 14 reads out the test signal set in the test signal register 19, and executes the test under the test conditions determined by the test signal. The test is executed by using a partially changed automatic erase sequence. A programming test will be explained below as an example (step S4). The automatic erase sequence is roughly divided into the following three stages:

(1) PreProgram (cell threshold values in an erase block are uniformly set at a high value)

(2) Erase (the threshold values of all cells in the erase block are decreased)

(3) Weak Program (weak programming is performed on an overerased cell to set a threshold value having a predetermined width)

Assume that in the programming test herein explained, only preprogram operation (1) is executed for the main body memory cell 20A, and operations (2) and (3) are skipped by the test signal. Assume also that the number of times of preprogramming can be changed by the test signal. When the number of times of preprogramming is set to 3, for example, a verification operation is performed after programming is performed three times, and the process is forcedly advanced to the next address. If the process advances to the next address without passing the verification, fail information is set in the defective block register 20C corresponding to the main body memory cell (erase block) 20A (step S5). Details of the programming test will be described below.

FIG. 4 is a flowchart showing the operation of the programming test.

First, the counter of the block address buffer & counter 15 is reset (to an initial value) (step P1), and subsequently the counter of the row/column address buffer & counter 16 is reset (step P2).

Then, a verification voltage is set (step P3), and verification is executed on the main body memory cell 20A (step P4).

If the verification result is NG in step P4, whether the number of times of programming is 3 is checked after programming data is generated (step P5). If the number of times of programming is not 3, a programming voltage is set (step P6), programming is performed (step P7), and the process returns to step P3.

If the number of times of programming is 3 in step P5, fail information is set in the defective block register 20C (step P8).

On the other hand, if the verification result is OK in step P4 or if the fail information is set in step P8, whether the row/column address in the row/column address buffer & counter 16 is the last address is checked (step P9).

If the row/column address is not the last address in step P9, the row/column address is incremented (step P10), the programming data is reset (step P11), and the process returns to step P4.

If the row/column address is the last address in step P9, the programming voltage is returned to the initial voltage setting (step P12). Subsequently, whether the block address in the block address buffer & counter 15 is the last address is checked (step P13).

If the block address is not the last address in step P13, the block address is incremented (step P14), and the process returns to step P2. If the block address is the last address, the operation of the programming test is complete.

As described above, if there is a memory cell which has not passed the programming test when the test is complete although programming is performed three times which is the number defined by the test signal, fail information is set in the defective block register corresponding to the main body memory cell (erase block) including the memory cell which has not passed the test. The foregoing are the operations in steps S4 and S5.

Then, a redundancy operation of replacing the main body memory cell 20A including the defective memory cell with the redundancy memory cell 21A is performed in steps S6 and S7.

First, a test command is input as in step S1 (step S6). This test command designates redundancy replacement. Subsequently, a test signal required for the operation is read out from the test signal storage unit 24A and set in the test signal register 19 as in step S2. The control circuit 14 reads out the test signal stored in the test signal register 19, and executes the redundancy replacing operation determined by the test signal (step S7).

The redundancy replacing operation is executed as follows. The block address buffer & counter 15 is reset, and all the blocks are sequentially scanned from the first block. The value of the defective block register 20C prepared for each main body memory cell 20A is checked, and whether the block redundancy cell area 21 has a free space is checked if fail information is set in the defective block register 20C. If the block redundancy cell area 21 has a free space, the main body memory cell 20A is replaced with the redundancy memory cell 21A, and the block address of the replaced main body memory cell is written in the redundancy circuit 22 corresponding to the redundancy memory cell 21A. If the block redundancy cell area 21 has no free space, it is impossible to remedy the defective main body memory cell by replacing it with the block redundancy cell area. In this case, test defect information is set in the status register 25. This operation is continued to the last block and terminated after that.

The above-mentioned embodiment can conduct a test by using only six pins, increase the number of chips which can be tested at the same time, and shorten the test time per chip. Therefore, the test cost can be greatly reduced. Also, the above embodiment can be implemented by only preparing a BIST interface circuit and a memory cell area forming test signal storage units. Accordingly, the increase in chip size can be minimized.

In addition, when a ROM or the like is used as a circuit for storing test conditions and the like, the test conditions are determined in the fabrication stage and cannot be changed later, so it is impossible to conduct various tests. This embodiment can readily change test conditions since the test conditions are written in the test signal storage unit immediately before the test is executed. Furthermore, the conventional test functions except for the interface circuit can be directly used, and the internal operation of a chip is exactly the same as the conventional operation. This makes it possible to shorten the circuit verification period and evaluation period of the test, and minimize the increase in development period.

The embodiment of the present invention can provide a nonvolatile semiconductor memory device capable of reducing the test time and a method of self-testing the same.

Note that the embodiment described above is not the only embodiment, and various embodiments can be formed by changing the configuration or adding various arrangements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:

a first nonvolatile memory cell which stores information;

a test interface which receives a test command designating execution of a test for the first nonvolatile memory cell;

a test storage circuit which stores test information necessary to execute the test designated by the test command, the test storage circuit comprising an erasable programmable second nonvolatile memory cell, the second nonvolatile memory cell having the same structure as the first nonvolatile memory cell;

a decoder which decodes the test command input to the test interface, and selects the test information stored in the test storage circuit based on the decoded test command input;

a sense amplifier which is common to the test storage circuit and first nonvolatile memory cell, reads out, from the test storage circuit, the test information selected by the decoder and reads out the information stored in the first nonvolatile memory cell;

a holding circuit which holds the test information read out by the sense amplifier;

a control circuit which controls a test operation of checking whether the first nonvolatile memory cell normally operates, on the basis of the test information held in the holding circuit; and a defect storage circuit associated with the first nonvolatile memory cell, the defect storage circuit storing fail information indicating that the first nonvolatile memory cell is defective if the first nonvolatile memory cell does not normally operate in the test operation performed by the control circuit.

2. The nonvolatile semiconductor memory device according to claim 1, further comprising:

a redundancy memory cell for replacing a defective memory cell if the fail information is stored in the defect storage circuit; and a redundancy circuit which is associated with the redundancy memory cell, and stores an address of the defective memory cell replaced with the redundancy memory cell.

3. The nonvolatile semiconductor memory device according to claim 2, which further comprises a status storage circuit which stores test defect information if the defective memory cell is not replaced with the redundancy memory cell, and in which the test defect information stored in the status storage circuit is read out from an outside via the test interface.

4. The nonvolatile semiconductor memory device according to claim 1, wherein the test storage circuit has a plurality of second nonvolatile memory cells, a plurality of pieces of test information necessary to execute a plurality of tests being stored in said plurality of second nonvolatile memory cells, and the decoder selects the test information from said plurality of the second nonvolatile memory cells accordance with the decoded test command.

5. The nonvolatile semiconductor memory device according to claim 1, which further comprises a test pad connected to the test interface, and in which the test pad receives the test command, and the test command is used as an address for selecting the second nonvolatile memory cell in the test storage circuit.

6. The nonvolatile semiconductor memory device according to claim 5, wherein the test pad receives a plurality of serial data as the test command.

7. The nonvolatile semiconductor memory device according to claim 1, further comprising:

a user pad which is used in a normal operation and receives a signal; and a command user interface which determines a command on the basis of the signal input to the user pad, and outputs a signal designating the command to the control circuit.

8. The nonvolatile semiconductor memory device according to claim 7, wherein the command user interface and the control circuit write the test information in the test storage circuit in accordance with the signal input to the user pad.

9. The nonvolatile semiconductor memory device according to claim 1, wherein
the first nonvolatile memory cell includes a NOR memory cell, and
the test storage circuit includes a NOR memory cell.

10. A nonvolatile semiconductor storage device comprising:
a plurality of memory cell blocks in which a plurality of first nonvolatile memory cells which store information are arranged;
a test interface which receives a test command designating execution of a test for said plurality of memory cell blocks;
a plurality of test storage circuits which store test information necessary to execute the test designated by the test command, each of said plurality of test storage circuits comprising an erasable programmable second nonvolatile memory cell, the second nonvolatile memory cell having the same structure as the first nonvolatile memory cell;
a decoder which decodes the test command input to the test interface, and selects a specific test storage circuit from said plurality of test storage circuits on the basis of a decoding result;
a sense amplifier which is common to the storage circuit and first nonvolatile memory cell, reads out the test information from the test storage circuit selected by the decoder and reads out the information stored in the first nonvolatile memory cells;
a holding circuit which holds the test information read out by the sense amplifier;
a control circuit which controls a test operation of checking whether said plurality of memory cell blocks normally operate, on the basis of the test information held in the holding circuit; and
a plurality of defective block storage circuits arranged in one to one correspondence with said plurality of memory cell blocks, each of said plurality of defective block storage circuits storing fail information indicating that a memory cell block is defective if the memory cell block does not normally operate in the test operation performed by the control circuit.

11. The nonvolatile semiconductor memory device according to claim 10, further comprising:
a plurality of redundancy cell blocks for replacing a defective memory cell block if the fail information is stored in said plurality of defective block storage circuits, each of said plurality of redundancy cell blocks includes a plurality of memory cells which store information; and
a plurality of redundancy circuits which are arranged in one to one correspondence with said plurality of redundancy cell blocks, and store an address of the defective memory cell block replaced with said plurality of redundancy cell blocks.

12. The nonvolatile semiconductor memory device according to claim 11, which further comprises a status storage circuit which stores test defect information if the defective memory cell block is not replaced with the redundancy cell block, and
in which the test defect information stored in the status storage circuit is read out from an outside via the test interface.

13. The nonvolatile semiconductor memory device according to claim 10, wherein a plurality of pieces of test information necessary to execute a plurality of tests are stored in said plurality of test storage circuits.

14. The nonvolatile semiconductor memory device according to claim 10, which further comprises a plurality of test pads connected to the test interface, and
in which said plurality of test pads include a data input/output pad, a test enable pad, a clock pad, an output enable pad, a power supply voltage pad, and a reference voltage pad, and
the data input/output pad receives the test command, and the test command is used as an address for selecting the test storage circuit.

15. The nonvolatile semiconductor memory device according to claim 14, wherein the data input/output pad receives a plurality of serial data as the test command.

16. The nonvolatile semiconductor memory device according to claim 10, further comprising:
a user pad which is used in a normal operation and receives a signal; and
a command user interface which determines a command on the basis of the signal input to the user pad, and outputs a signal designating the command to the control circuit.

17. The nonvolatile semiconductor memory device according to claim 16, wherein the command user interface and the control circuit write the test information in said plurality of test storage circuits in accordance with the signal input to the user pad.

18. The nonvolatile semiconductor memory device according to claim 10, wherein
the first nonvolatile memory cell includes a NOR memory cell, and
the test storage circuit includes a NOR memory cell.

19. A method of self testing a nonvolatile semiconductor memory device, comprising:
writing test information necessary to execute a test to be designated by a test command and conducted on a first nonvolatile memory cell, in a test storage circuit comprising an erasable programmable second nonvolatile memory cell, the second nonvolatile memory cell having the same structure as the first nonvolatile memory cell;
inputting the test command to a test interface;
selecting the test information from the test storage circuit in accordance with the decoded input test command;
using a common sense amplifier, reading out the selected test information from the test storage circuit and reading out information stored in the first nonvolatile memory cell;
holding the readout test information;
controlling a test operation of checking whether the first nonvolatile memory cell normally operates, on the basis of the held test information;
storing, in a defect storage circuit, fail information indicating that the first nonvolatile memory cell is defective, if the first nonvolatile memory cell does not normally operate in the test operation;
replacing a defective memory cell with a redundancy memory cell if the fail information is stored in the defect storage circuit; and
storing an address of the defective memory cell replaced with the redundancy memory cell in a redundancy circuit.

20. The method of self testing a nonvolatile semiconductor memory device according to claim 19, which further comprises storing test defect information in a status storage circuit if the defective memory cell is not replaced with the redundancy memory cell, and
in which the test defect information stored in the status storage circuit is read out from an outside via the test interface.

* * * * *